United States Patent [19]

Shelly

[11] Patent Number: 4,536,733
[45] Date of Patent: Aug. 20, 1985

[54] HIGH FREQUENCY INVERTER TRANSFORMER FOR POWER SUPPLIES

[75] Inventor: Randolph D. Shelly, Rosemere, Canada

[73] Assignee: Sperry Corporation, New York, N.Y.

[21] Appl. No.: 430,534

[22] Filed: Sep. 30, 1982

[51] Int. Cl.³ .............................................. H01F 27/30
[52] U.S. Cl. ..................................... 336/182; 336/200; 336/223; 336/229
[58] Field of Search ................. 336/229, 223, 200, 65, 336/180, 182; 174/159, 48

[56] References Cited

U.S. PATENT DOCUMENTS

| | | | |
|---|---|---|---|
| 2,709,791 | 5/1955 | Anderson, Jr. | 336/229 X |
| 3,281,005 | 10/1966 | Schumacher | 174/48 X |
| 3,675,176 | 7/1972 | Brown | 336/229 X |
| 4,103,267 | 7/1978 | Olschewski | 336/229 X |
| 4,455,545 | 6/1984 | Shelly | 336/200 |

FOREIGN PATENT DOCUMENTS

| | | | |
|---|---|---|---|
| 532743 | 9/1955 | Italy | 174/159 |
| 128805 | 10/1980 | Japan | 336/229 |
| 771701 | 4/1957 | United Kingdom | 336/200 |
| 1085676 | 10/1967 | United Kingdom | 336/200 |
| 653630 | 3/1979 | U.S.S.R. | 336/200 |

OTHER PUBLICATIONS

*IBM Technical Disclosure Bulletin*, A. Werner, "Hybrid Toroidal Transformer Winding," vol. 17, No. 7, 12/74, p. 1993.

*Primary Examiner*—Thomas J. Kozma
*Attorney, Agent, or Firm*—Howard P. Terry

[57] ABSTRACT

A low leakage inductance inverter transformer utilizing a torodial ferrite core having a primary winding wound thereon, with the secondary winding constructed from stamped conductive clips ranged to encompass portions of the core and primary winding with clip interconnections formed by printed circuit interconnections is described. The conductive clip described includes integral pins for making connection to printed circuit wiring on a printed circuit board. The turns ratio is selected by the pattern of printed circuit interconnection of the conductive clips such that the transformer structure turns ratio is established by the associated printed circuit interconnection pattern.

12 Claims, 16 Drawing Figures

EIGHT CLIP-TURNS IN PARALLEL
FORM SINGLE TURN EACH SIDE

2-VOLT CONNECTION

TWO-TURN
CENTER-TAP SECONDARY

FOUR CLIP-TURNS IN PARALLEL
FORM TWO TURNS EACH SIDE

5-VOLT CONNECTION

FOUR-TURN
CENTER-TAP SECONDARY

TWO CLIP-TURNS IN PARALLEL
FORM FOUR TURNS EACH SIDE

12-VOLT CONNECTION

EIGHT TURNS EACH SIDE

24-VOLT CONNECTION

EIGHT-TURN
CENTER-TAP SECONDARY

SIXTEEN-TURN
CENTER-TAP
SECONDARY

HIGH FREQUENCY INVERTER TRANSFORMER FOR POWER SUPPLIES

BACKGROUND OF THE INVENTION

1. Field of the Invention

This invention relates to an improved structure for a transformer. More particularly, it relates to an improved inverter transformer structure operable at high frequencies in a power supply.

2. State of the Prior Art

In the development of power supplies for use with electronic components, particularly those circuits utilizing integrated circuits, it has been found to be advantageous to utilize a transformer having a ferrite core with a primary winding for coupling to a source of alternating signals, and a secondary winding center-tapped and arranged to operate push-pull to drive a bridge rectifier. It is desirable that transformers for use in such circuitry function with low leakage inductance at rates of 200 kHz or higher. Further, it is desirable that such transformers be adaptable for providing output voltages in a predetermined range, dependent upon the wiring interconnection of the transformer. For example, it is desirable that a transformer structure be available for supplying drive for a rectifier circuit that will ultimately selectively provide through an associated voltage regulator an output of 2 volts, 5 volts, 12 volts or 24 volts.

It is desirable that a transformer structure for use in the type of power supply environment described above be inexpensive and easy to construct. In this regard it is desirable that the transformer structure be compatible with use on printed circuit assemblies, and that the transformer not be complex to manufacture.

Attempts have been made in the prior art to adapt various manufacturing techniques to make transformers that have varying functional characteristics. A system for die casting core windings is described in U.S. Pat. No. 3,477,051 to Clark et al, and a specialized pulse transformer and method of manufacturing is described in U.S. Pat. No. 3,483,495 to Clark et al. Examination of the teaching of these patents makes it abundantly clear that the fabrication process is complex. U.S. Pat. No. 4,311,979 to Graul describes a method and structure for generating a transformer having layered windings. It has been pointed out in the prior art that the so-called layer transforms have developed operational problems, often times apparently traceable to localized heat buildup.

U.S. Pat. No. 3,144,628 to Rabins describes a power transformer having cylindrical independent windings concentrically arranged, and capable of interconnection in selected series/parallel arrangements for adjusting the turns ratio. The arrangement is specified for providing a given output voltage for different input voltages.

U.S. Pat. No. 2,765,448 to Duffing, and U.S. Pat. No. 2,907,968 to Thurk each describe forming coils for switching reactors constructed from interconnected independent segments.

U.S. Pat. No. 4,249,229 to Hester describes a transformer utilizing flexible electrical cable for making auxiliary couplings to the transformer.

In addition to the interconnected independent segments for forming a coil mentioned above, U.S. Pat. No. 3,453,574 to DeParry describes a high frequency transformer wherein the primary and secondary windings are constructed from interconnected independent segments of coaxial cable with the turns ratio determined by the combination of interconnection of the conductive portion and the shield portion of the coaxial segments. The teaching in U.S. Pat. No. 4,103,267 to Olschewski attends itself to teaching a structure of a transformer for use with integrated circuit assemblies. The transformer described therein is comprised of a toroidal ferrite core affixed to a substrate having printed circuit paths affixed thereto. Primary and secondary windings are formed by interconnected segments of wire arranged to loop the core.

OBJECTS

It is a primary object of this invention to provide a low leakage inductance inverter transform.

Another object is to provide an improved inverter transformer that can be readily adapted to provide a selected one of a plurality of output voltages.

Yet another object of this invention is to provide an approved transformer that is capable of functioning at 200 kHz and above.

Still another object of the invention is to provide an improved inverter transformer that is inexpensive to manufacture.

Another object of the invention is to provide an improved conductive clip for use in forming secondary windings in an improved inverter transformer.

SUMMARY OF THE INVENTION

In view of the foregoing, the present invention provides an improved inverter transformer that utilizes a toroidal ferrite core having a primary winding wound thereon. A predetermined number of conductive clips are arranged to encompass portions of the toroidal core and primary winding. The conductive clips are selectively interconnected by printed circuit paths on a mounting printed circuit board whereby the turns ratio is established by the printed circuit interconnections. This results in the transformer structure being capable of selectively providing one of a predetermined number of output voltages in response to an input signal applied to the primary winding.

When used in a high frequency inverter power supply system driven, for example by power field effect transistors, operating at rates in the range of 100 kHz are common, with rates in the range of 200 kHz or more being available. These relatively high frequencies result in excessive leakage inductance of the transformers of the prior art designs. Excessive leakage inductance is known to inhibit regulation in a power supply system, and results in excessive circuit losses. The design of the conductive clips of the present invention in combination with the toroidal ferrite core and primary windings results in a circuit operation that minimizes leakage inductance when driven at the relatively high frequency rates.

The foregoing stated objectives and other more detailed and specific objectives will become apparent from a consideration of the drawings when taken together with the description of preferred embodiments.

DESCRIPTION OF THE PREFERRED EMBODIMENTS

Figure 1:
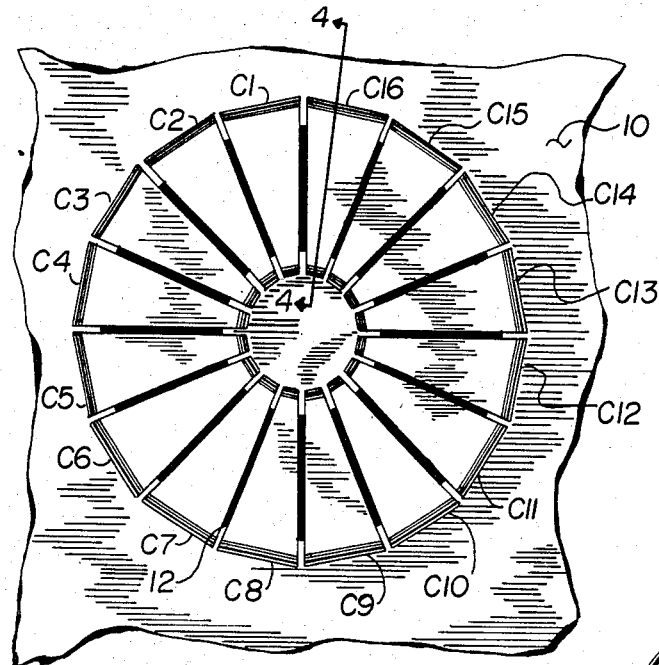
FIG. 1 is a top plan view of the low leakage inductance inverter transformer of the present invention.

FIG. 1 is a top plan view of the low leakage inductance inverter transformer of the present invention. A portion of a printed circuit board 10, of a type well-known in the art, is shown supporting a toroidal ferrite core assembly 12. Coupling clips labeled C1 through C16 are positioned around core assembly 12. The clips C1 through C16 form the secondary winding of the improved transformer through interconnections made on the printed circuit board 10. This interconnection system will be described in more detail below. The printed circuit board 10 is the same support assembly that can be utilized to support other electronic components.

Figure 2:
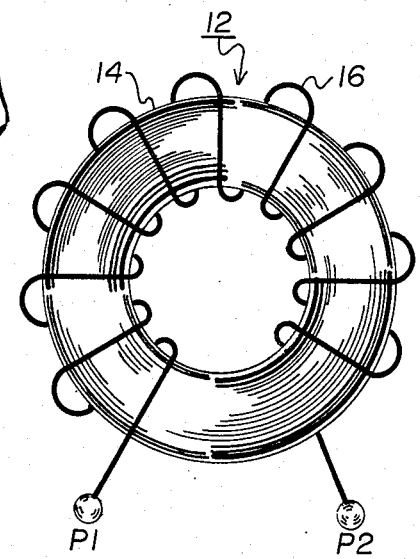
FIG. 2 is a plan schematic view of a toroidal ferrite core with a primary winding wound thereon.

FIG. 2 is a plan schematic view of a toroidal ferrite core with a primary winding wound thereon. The toroidal ferrite core assembly 12 is comprised of a toroidal ferrite core 14 and is available commercially from Magnetics, Inc., and is identified as part No. 43806-TC for a preferred embodiment. The core 14 has an outside diameter of 1.5 inches, a hole diameter of 0.75 inch, and a height of 0.25 inch. The core assembly 12 has a primary winding 16 wound thereon. For a preferred embodiment, primary winding 16 utilizes 34 turns of No. 20 wire with input terminals labeled P1 and P2 for receiving input signals. The primary winding 16 is applied in a manner known, with the windings being evenly spaced around core 14. The primary winding wire is coated with an electrically insulating material. The clips C1 through C16 of FIG. 1 are evenly spaced, and couple the evenly distributed windings of primary winding 16.

The section of sixteen clips relates to the number of desired combinations of secondary turns ratios, as will be described in more detail below, for selectively providing output signals for generating 2 volts, 5 volts, 12 volts, or 24 volts from the associated power supply (not shown). In the event it would occur that 24 volts would not be needed as a selection, the number of clips could be reduced to eight, with the clips being proportionately wider and evenly displaced, and still yield the interconnection combinations capable of providing the requisite number of turns ratio combinations.

Figure 3:
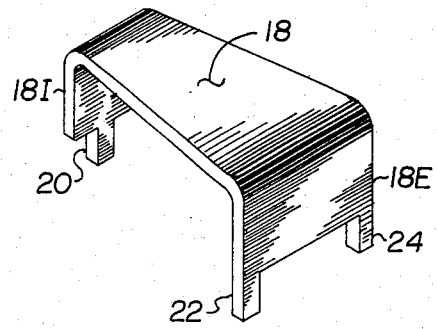
FIG. 3 is a perspective view of the conductive clip utilized for forming secondary winding configurations.

FIG. 3 is a perspective view of the conductive clip utilized for forming secondary winding configurations. The novel clip utilized for forming the secondary winding formation has a body portion 18 that is generally wedge-shaped. The body portion 18 has an interior downwardly extending portion 18I, and an exterior downwardly extending portion 18E. At the lower extremity of the interior downwardly extending member 18I there is formed a pin member 20 that is utilized for making electrical interconnection to plated-through holes in an associated printed circuit board. This interconnection system will be described in more detail below. The exterior downwardly extending member 18E has two pin members 22 and 24 formed at the lower extremity thereof. These pin members are also adapted for making electrical connection via plated-through holes in an associated printed circuit board. The use of the single pin 20 at the interior portion of the clip and the two pins 22 and 24 at the exterior end of the clip provides for stability of mounting and physical strength, and further provides for precise positioning of the clips with relationship to each other, and with relationship to the wound core assembly 12.

The clips C1 through C16 can be formed from commercially available flat copper sheets by stamping processes. The characteristic thickness of the copper sheet material is 0.035 inch. For a characteristic embodiment utilizing sixteen clips, a minimum width dimension of 0.075 inch at the interior end, and a maximum width dimension at the exterior end of 0.275 inch, a length of 0.645 inch and a height of 0.6 inch has been found to function with the core assembly 12 described above. The pins 20, 22, and 24 are of sufficient length to pass through an associated printed circuit board 10.

Figure 4:
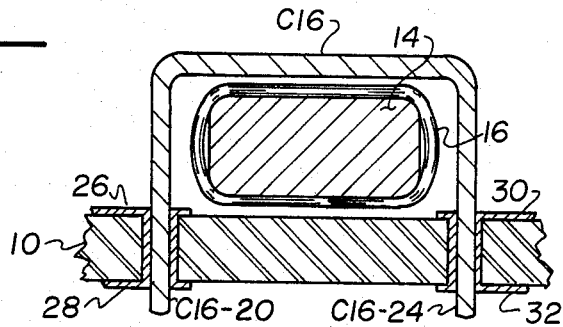
FIG. 4 is a sectional view taken along line 4—4 in FIG. 1.
Figure 5:
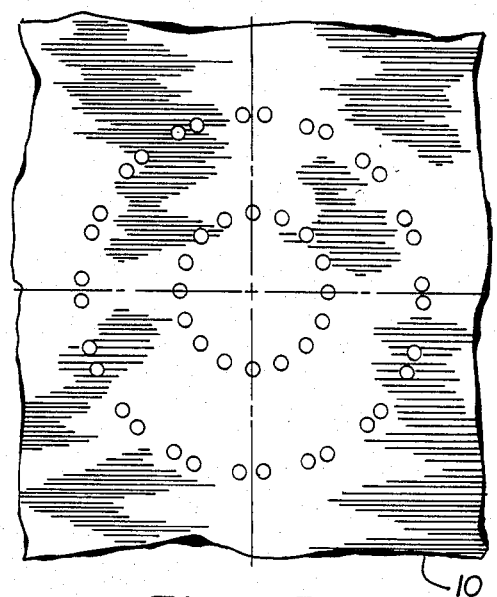
FIG. 5 is a plan view of the mounting holes utilized in a printed circuit assembly for mounting the conductive clips.

FIG. 4 is a sectional view taken along line 4—4 in FIG. 1. This illustrates that the ferrite core 14 is closely coupled by the evenly spaced windings of the primary 16, and the clip C16 surrounds the core and primary winding assembly for making interconnection with printed circuit board 10. Printed circuit board 10 has plated-through holes for receiving pins C16-20 and C16-24. When finally assembled, these pins will be soldered to the interior surfaces of the associated plated-through holes. The holes are in electrical contact with deposited printed circuit foil on both the upper and the lower surfaces of printed circuit board 10. Conductive foil 26 on the upper layer and foil 28 on the lower surface are electrically connected to pin C16-20. In a similar manner, conductive foil 30 on the upper surface and conductive foil 32 on the lower surface are in electrical contact with pin C16-24. It is the selected patterns of interconnection of the clip pins that forms the selection of the turns ratio of the secondary winding. FIG. 5 is a plan view of the mounting holes utilized in a printed circuit assembly for mounting the conductive clips. The hole pattern is drilled and the holes plated-through, thereby defining the clip positioning on printed circuit board 10. Once drilled and plated, the board 10 is ready for the selection of the clip interconnection patterns, and their formation on the upper and lower surfaces thereof.

Figure 6:
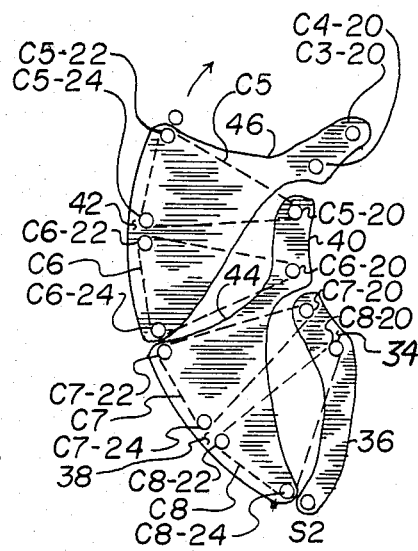
FIG. 6 is an illustrative printed circuit interconnection connecting two conductive clips in parallel and connecting paralleled clips in series.

FIG. 6 is an illustrative printed circuit interconnection connecting two conductive clips in parallel and connecting paralleled clips in series. This example of interconnection illustrates that clips C7 and C8 are coupled in parallel with each other and clips C5 and C6 are coupled in parallel with each other. These paralleled clip arrangements are coupled in series with each other. When sixteen clips are utilized to generate the secondary windings, this interconnection arrangement will result in the eight-turn center-tap secondary illustrated and described with FIG. 11a and FIG. 11b below. Clips C5, C6, C7 and C8 are shown dashed lined. Interior pins C7-20 and C8-20 are coupled together by conductive foils 34, which in turn is coupled via foil 36 to the S2 output terminal. This comprises the center-tap connection. Exterior pins C7-22, C7-24, C8-22 and C8-24 are coupled together via foil 38. In a similar manner, interior pins C5-20 and C6-20 are coupled together via foil 40. Exterior pins C5-22, C5-24, C6-22 and C6-24 are coupled in common via foil 42. These interconnections of the pairs of internal and external pins effectively results in the associated clips being coupled in parallel. Foil 44 couples interior pins C5-20 and C6-20 in series with exterior pins C7-22, C7-24. C8-22 and C8-24. In a similar manner foil 46 couples the exterior pins of clips C5 and C6 to the interior pins C4-20 and C3-20 of the next successive pair. This arrangement continues around the array of clips and forms the parallel-serial interconnection specified.

Figure 7:
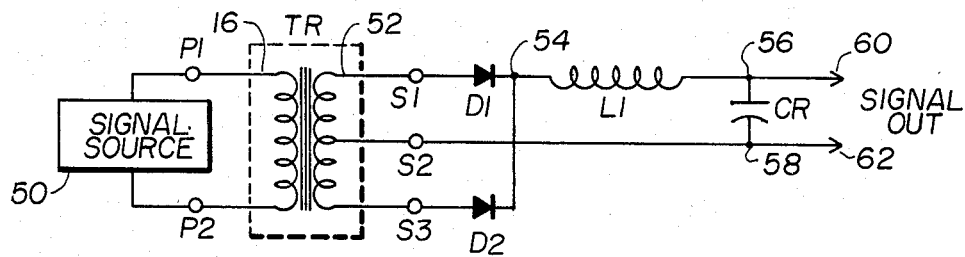
FIG. 7 is an illustrative schematic circuit diagram utilizing the inverter transformer.

FIG. 7 is an illustrative schematic circuit diagram utilizing the inverter transformer. A Signal Source 50 is coupled across the terminals P1-P2 of the primary winding 16 of transformer TR. The Signal Source can be from a power field effect transistor driver circuit or other suitable souce of signals. The secondary winding 52, made up of the clips and printed circuit connection pads, has output terminals S1 and S3, with a center-tap terminal S2. Diode D1 is coupled between terminal S1 and circuit junction 54, and diode D2 is coupled between terminal S3 and circuit junction 54. Output inductor L1 is coupled serially between circuit junction 54 and circuit junction 56. Capacitor CR is coupled across circuit junction 56 and circuit junction 58. The output signal is provided at output terminals 60 and 62. The use of the output signals would characteristically be that of input to regulator circuits (not shown) and ultimately distributing the rectified regulated D.C. voltage to associated circuitry.

Figure 8:
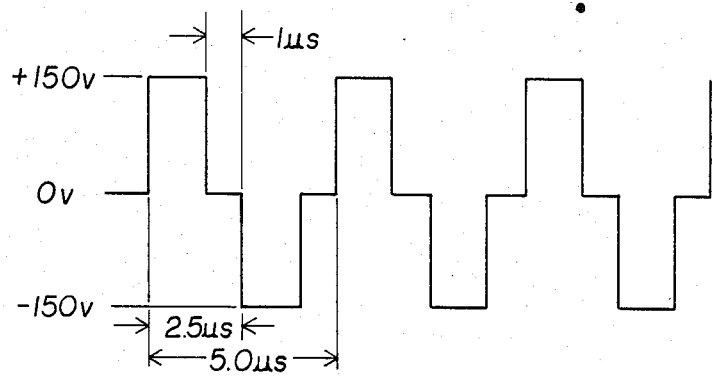
FIG. 8 is an idealized waveform drawing of input signals applied to the primary winding.

FIG. 8 is an idealized waveform drawing of input signals supplied to the primary winding. The output signal available across the secondary of the transformer will be a similar waveform attentuated by the turns ratio selected for the particular embodiment.

Figure 9A:
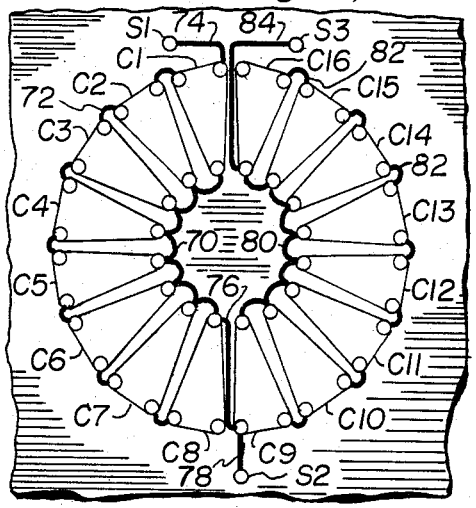
FIG. 9a is a diagrammatic plan layout of eight clip-turns arranged in parallel to form a single secondary turn winding on each side.

FIG. 9a is a diagrammatic plan layout of eight clip-turns arranged in parallel to form a single secondary turn winding on each side. For this embodiment, clips C1 through C8 are electrically connected in parallel by wires 70 at the inner pin terminals and by wires 72 at the outer pin terminals. Output terminal S1 is coupled by wire 74 to an outer terminal of clip C1. An inner terminal of clip C8 is connected by wire 76 to an output terminal of clip C9 which in turn is coupled to center-tap output terminal S2, by wire 78. In a similar manner, clips C9 through C16 are coupled in parallel by wires 80 at the inner terminals and by wires 82 at the outer pins. Output terminal S3 is coupled to the inner pin of clip C16 by wire 84. This arrangement results in a center-tap secondary winding of two turns. For the turns ratio specified, this embodiment is utilized in generating a 2 volt ultimate output signal level. It should be understood that the pin interconnection wires illustrated are accomplished by printed circuit interconnections in the preferred embodiment, and are accomplished in the manner previously described. It should be understood that this voltage level is dependent upon the input signal applied to the primary winding, in conjunction with the established turns ratio, and the rectifier and regulation circuitry with which the transformer would be associated.

Figure 9B:
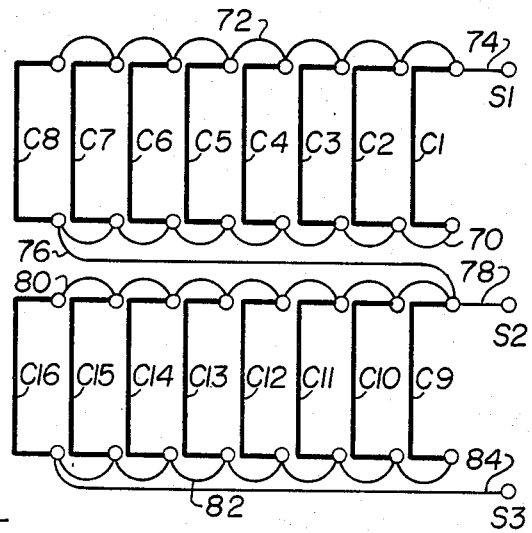
FIG. 9b is a schematic diagram of a two-turn center-tap secondary.

FIG. 9b is a schematic diagram of a two-turns center-tap secondary. This configuration is a schematic of the diagrammatic representation of FIG. 9a. Elements described with reference thereto are given the same reference numerals. This same procedure will be followed in description of other embodiments.

Figure 10A:
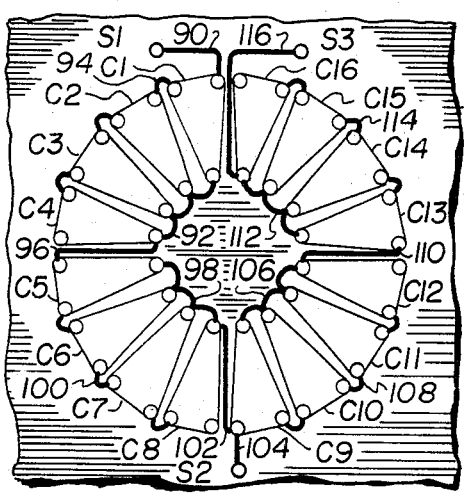
FIG. 10a is a diagrammatic plan layout drawing of four clip-turns in parallel to form two turns on each side of the secondary.

FIG. 10a is a diagrammatic plan layout drawing of four clip-turns in parallel to form two turns on each side of the secondary. For this embodiment, secondary terminal S1 is coupled by wire 90 to the outer terminal of clip C1. Clips C1 through C4 are coupled in parallel, with the inner pins being coupled together by wires 92 and the outer terminals coupled together by wires 94. Clips C5 through C8 are coupled in parallel. The parallel coupling of clips C1 through C4 are coupled in series to the parallel coupling of clips C5 through C8 by wire 96. The inner terminals of clips C5 through C8 are coupled together by wires 98 and the outer terminals are coupled together by wire 100. The inner terminal of clip C8 is coupled to the outer terminal of clip C9 by wire 102, and the center-tap connection S2 is coupled thereto by wire 104. The other half of the winding arrangement is similarly arranged with clip C9 through C12 coupled in parallel by wires 106 at the inner terminals and wires 108 at the outer terminals. The serial connection to the next set of clips is made by wire 110 coupling the inner terminal of clip C12 to the outer terminal of clip C13. Finally, clips C13 through C16 are coupled in parallel by wires 112 at the inner terminals and wires 114 at the outer terminals thereof. The inner terminal of clip C16 is coupled via wire 116 to output terminal S3. This configuration is utilized to generate a 5 volt output.

Figure 10B:
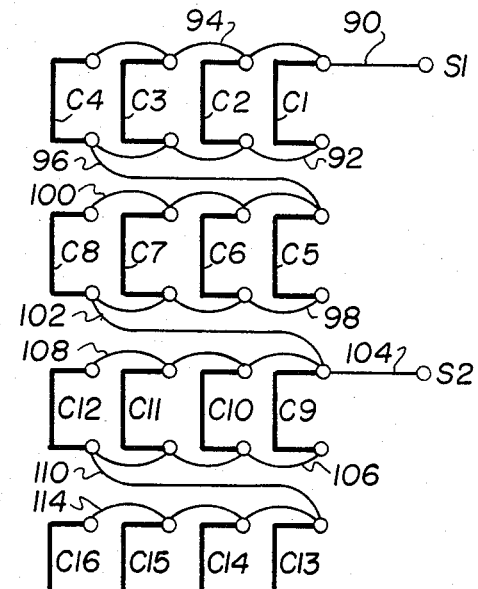
FIG. 10b is a schematic diagram of a four-turn center-tap secondary.

FIG. 10b is a schematic diagram of a four-turn center-tap secondary. This schematic illustrates sets of four clips connected in parallel, with the sets coupled in series to form two secondary turns on each side of the secondary.

Figure 11A:
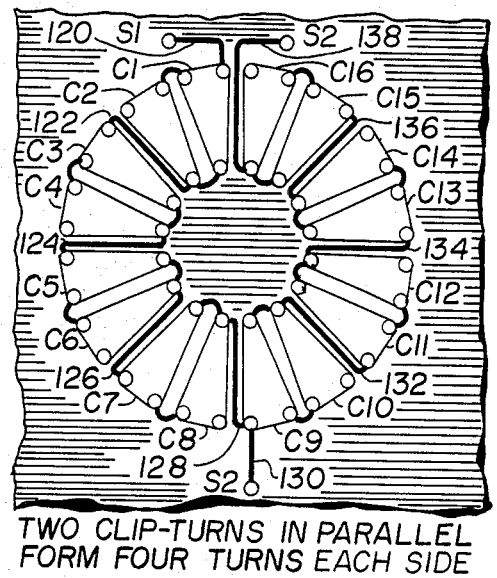
FIG. 11a is a diagrammatic plan representation of two clip-turns in parallel to form four turns on each side of the secondary.

FIG. 11a is a diagrammatic plan representation of two clip-turns in parallel to form four turns on each side of the secondary. This embodiment provides a turns ratio for yielding a 12 volt output connection from the power supply with which associated. In this embodiment, pairs of clips are coupled in parallel and pairs are connected in series in a manner such that four secondary turns are formed on each half of the secondary winding. The wiring configuration is that described in detail with regard to FIG. 6. Secondary terminal S1 is coupled to the outer pin of clip C1 by wire 120. The clips are coupled in pairs in parallel by wires interconnecting the inner terminals and the outer terminals of the adjacent pairs. The pairs coupled in series with clips C1 and C2 are coupled via wire 122 to clips C3 and C4, which in turn are coupled via wire 124 to clips C5 and C6, and in turn are coupled to clips C7 and C8 by wire 126. Clips C7 and C8 are coupled by wire 128 to clips C9 and C10, with this junction coupled to the center-tap terminal S2 by wire 130. The second half of the secondary is similarly arranged with clip C9 and C10 coupled via wire 132 to C11 and C12. These clips are coupled via wire 134 to clips C13 and C14, with the final pair connection being coupled via wire 136 to clips C15 and C16. The latter pair of clips are coupled via wire 138 to output terminal S3.

Figure 11B:
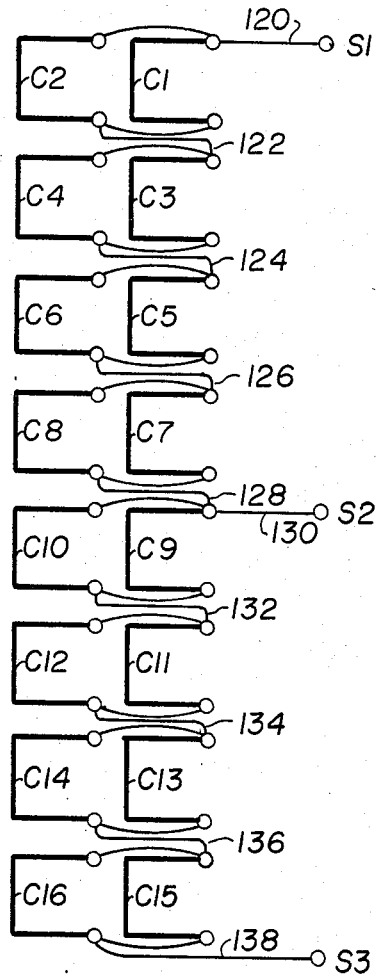
FIG. 11b is a schematic diagram of an eight-turn center-tap secondary.

FIG. 11b is a schematic diagram of an eight-turn center-tap secondary. This schematic diagram representation illustrates the schematic interrelationship of the serial interconnection of paralleled pairs of clips to form the secondary winding for this embodiment. Elements previously referenced by reference numerals with regard to FIG. 11a bear the same reference numerals.

Figure 12A:
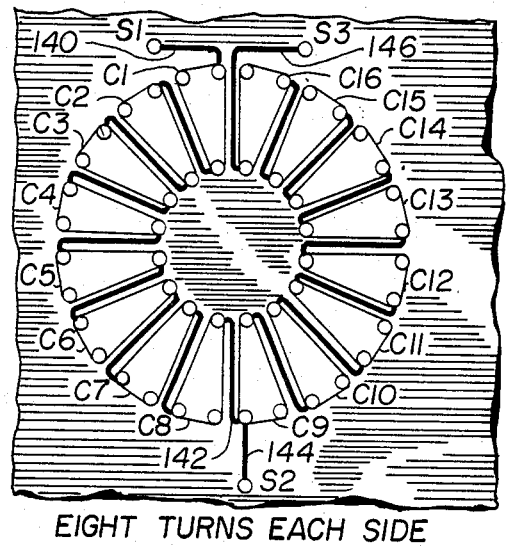
FIG. 12a is a diagrammatic plan view of serialized connection of sixteen clips providing eight turns on each side.

FIG. 12a is a diagrammatic plan view of serialized connection of sixteen clips providing eight turns on each side. This embodiment is formed by alternately connecting inner terminals of adjacent clips interleaved with connection of external terminals of adjacent clip pairs. In this regard, terminal S1 is coupled via wire 140 to the external terminal of clip C1, with the internal terminal of clip C1 coupled to the internal terminal of clip C2. The external terminal of clip C2 is coupled to the external terminal of clip C3. This configuration continues around the entire secondary with the internal terminal of clip C8 being coupled via wire 142 to the external terminal of clip C9. The latter terminal is coupled via wire 144 to output terminal S2. The serial interconnection of clips continues for clips C9 through C16 with the internal terminal of clip C16 coupled via wire 146 to output terminal S3. This embodiment is utilized for generating a 24 volt interconnection when utilized in a power supply.

Figure 12B:
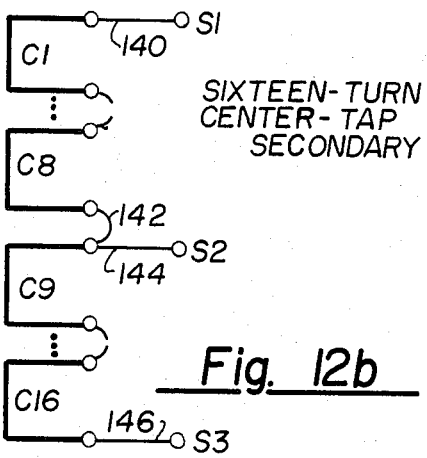
FIG. 12b is a schematic diagram of a sixteen-turn center-tap secondary.

FIG. 12b is a schematic diagram of a sixteen-turn center-tap secondary. This schematic diagram illustrates the serial interconnection of adjacent clips to form the sixteen-turn secondary.

The foregoing description of the different embodiments have referred to a wire interconnection. The preferred wiring interconnection is formed by printed circuit foil deposited on a printed circuit board with which the improved transformer will be utilized. It can be seen, then, that the output voltage for the selected embodiment is determined by the printed circuit pattern of clip interconnection.

In the preferred embodiments, it is recognized that it is desirable to provide an improved transformer that will be utilized with a rectifier circuit utilizing diodes. In such arrangements, it is necessary that the transformer provide sufficient voltage to overcome the forward voltage drop of associated diodes. Characteristically, the forward voltage drop for diodes of this type are in the order of 0.7 volt. For a 2 volt supply then, it is desirable that the turns ratio be such that the output is approximately 2.7 volts. Doubling the secondary turns then results in approximately 5.4 volts output which is an approximation of the 5.7 volts that would be required for a 5 volt supply, when taking into account the forward drop of associated diodes.

Having described embodiments that satisfy the various stated purposes and objectives of the invention, and without departing from the spirit and scope of the invention, what is intended to be protected by Letters Patent is set forth in the appended claims.

What is claimed is:

1. In a low leakage inductance high frequency transformer of the type having a toroidal core about a central axis normal to the plane thereof, with a first winding distributed thereon, the toroidal core supported by a printed circuit board having a pattern of holes drilled therein and predetermined patterns of electrical interconnection between said holes for forming a second winding with a predetermined turns ratio about the toroidal core, the improvement wherein said second winding comprises:

a plurality of independently formed conductive clips for interconnecting predetermined ones of said holes, each of said clips including a substantially planar wedge-shaped electrically conductive body of a length sufficient to span a portion of said toroidal core and a portion of said first winding, each of said clips having first and second ends extending at predetermined angles to said body, said first and second ends having pins extending therefrom for permitting interconnection to said predetermined patterns of electrical interconnection on said supporting printed circuit board, said first ends, second ends, and body of pairs of said chips respectively disposed in abutting relationship;

said clips further radially disposed with respect to said central axis.

2. The transformer as set forth as in claim 1 wherein said pins further comprise a single pin at said first end proximal to said central axis and at least two pins at said second end distal to said central axis for providing circuit connection points and mounting stability.

3. The transformer as set forth in claim 2 wherein said conductive body has a first width dimension at said first end and a second width dimension greater than said first width dimension at said second end.

4. An improved low leakage inductance high frequency inverter transformer of the type having a first and second winding on a toroidal core and a central axis normal to the plane therethrough comprising:

a printed circuit board having a predetermined array of clip mounting holes therein, each of said holes comprising electrically conductive means, and predetermined ones of said holes electrically coupled together by printed circuit conductive means for defining one of a plurality of available winding patterns for said second winding;

said first winding distributed on said toroidal core for receiving input signals;

a plurality of independently formed substantially planar wedge-shaped electrically conductive clips for forming said second winding, each of said clips including pins extending therefrom for engaging associated ones of said holes in said printed circuit board and making electrical interconnection therewith, each of said clips adapted for inductive coupling to a predetermined segment of said first winding;

each of said clips radially disposed with respect to said central axis.

5. An improved transformer as in claim 4 wherein predetermined ones of said clips are electrically connected in parallel by ones of said printed circuit conductive means on said printed circuit board and the paralleled groupings of said clips thus formed are electrically connected in series by other ones of said printed circuit conductive means mounted on said printed circuit board, thereby defining the number of turns of said second winding.

6. An improved transformer as in claim 5 wherein each of said clips comprises:
an electrically conductive body of a length sufficient to span a portion of said toroidal core and a portion of said first winding, said body having first and second ends integrally formed and extending at predetermined angles thereto;
ones of said pins integrally formed with said first and second ends respectively.

7. An improved transformer as in claim 6 wherein said body includes a single pin at said first end and at least two pins at said second end for providing circuit connection points and mounting stability.

8. An improved transformer as in claim 7 wherein said conductive body has a first width dimension at said first end and a second width dimension greater than said first width dimension at said second end.

9. An improved transformer as in claim 5 comprising:
a first contiguous one-half of said plurality of clips coupled in parallel by first ones of a plurality of said printed circuit conductive means;
a second contiguous one-half of said plurality of clips coupled in parallel by second ones of said plurality of printed circuit conductive means; and
third ones of said printed circuit conductive means for coupling said first and second contiguous one-half paralleled plurality of clips in series to form a two-turn secondary winding.

10. An improved transformer as in claim 5 wherein said clips are divided into four groups of contiguous ones of said clips, and said clips in each of said groups are coupled in parallel by first associated ones of said printed circuit conductive means; and
second ones of said printed circuit conductive means are adapted for coupling said four groups of clips of in series to form a secondary winding having turns of the number of said clips divided by four.

11. An improved transformer as in claim 5 wherein associated first ones of said printed circuit conductive means couple pairs of said clips in parallel; and
second ones of said printed circuit conductive means couple said pairs in series to form a secondary winding having turns of the number of said clips divided by two.

12. An improved transformer as in claim 5 wherein ones of said printed circuit conductive means couple said clips in series to form a secondary winding having turns equal to the number of said clips.

* * * * *